United States Patent
Al-Sarawi

(10) Patent No.: US 6,897,528 B2
(45) Date of Patent: May 24, 2005

(54) ELECTRICALLY CONTROLLED VERY HIGH VALUE FLOATING CMOS RESISTOR

(75) Inventor: Said Al-Sarawi, Gulfview Heights (AU)

(73) Assignee: The University of Adelaide, Adelaide (AU)

( * ) Notice: Subject to any disclaimer, the term of this patent is extended or adjusted under 35 U.S.C. 154(b) by 0 days.

(21) Appl. No.: 10/487,795
(22) PCT Filed: Sep. 2, 2002
(86) PCT No.: PCT/AU02/01196

§ 371 (c)(1),
(2), (4) Date: Apr. 12, 2004

(87) PCT Pub. No.: WO03/019778

PCT Pub. Date: Mar. 6, 2003

(65) Prior Publication Data

US 2004/0256695 A1 Dec. 23, 2004

(30) Foreign Application Priority Data

Aug. 31, 2001 (AU) .............................. PR7389

(51) Int. Cl.$^7$ ..................... H01L 27/12; H01L 31/0392; H01L 29/00
(52) U.S. Cl. ....................................... 257/351; 257/536
(58) Field of Search ............................... 257/350–359, 257/536–538

(56) References Cited

U.S. PATENT DOCUMENTS 6,777,752 B2 * 8/2004 Osanai et al. ............... 257/350

FOREIGN PATENT DOCUMENTS

GB 2 270 220 A 3/1994

* cited by examiner

Primary Examiner—Cuong Nguyen
(74) Attorney, Agent, or Firm—Irving M. Weiner; Pamela S. Burt; Weiner & Burt, P.C.

(57) ABSTRACT

The present invention provides a circuit arrangement to convert fixed, or grounded resistors, to floating resistors. In particular, the circuit arrangement provides for the coupling of active electrical resistance devices to provide a relatively high value electrical resistance between two non-grounded nodes of the circuit arrangement in the order of Giga-ohms. The invention further provides for the magnitude of the floating electrical resistance to be determined by the magnitude of electrical current supply thus providing a means to select the magnitude of the floating electrical resistance by selecting by selecting the magnitude of electrical current supply. The circuit arrangement requires relatively few active devices and consumes a relatively small amount of electrical power in operation. The floating resistor of the present invention may be used in applications where a relatively high value resistor consuming a relatively small area of silicon, exhibiting relatively good linearity and wide dynamic range are required. Applications for such a device include neural networks, image processing and vision systems.

11 Claims, 9 Drawing Sheets

ELECTRICALLY CONTROLLED VERY HIGH VALUE FLOATING CMOS RESISTOR

FIELD OF THE INVENTION

This invention relates generally to a means of providing a high value floating resistor for integrated electrical circuits and a method of producing such a high value floating resistor. More particularly, the invention relates to a circuit arrangement that provides for coupling to a grounded resistance device such that the circuit arrangement presents a high value resistance between two floating, or non-grounded, nodes of the circuit arrangement.

BACKGROUND TO THE INVENTION

The physical constraints of integrated circuits do not allow for the inclusion of standard fixed resistors as used in non-integrated electrical circuits. However, in various applications, the use of resistors, or resistance devices, in an integrated circuit is beneficial.

As a result, various techniques have been employed in order to provide an electrical resistance device in an integrated circuit that may be manufactured during the process of manufacturing the integrated circuit device.

Most commonly, poly silicon was used to provide an electrical resistance in integrated circuit arrangements. Whilst this technique is feasible, poly silicon is limited in the range of electrical resistance it can present to the order of 1 to 3 k$\Omega$'s whilst at the same time consuming a relatively large region of silicon associated with widespread end resistance value.

Alternatively, active devices such as MOSFET devices have been used in a particular arrangement such that they present an electrical resistance between two nodes. Use of these devices has enabled the provision of electrical resistances in the order of 500 to 600 k$\Omega$'s.

Whilst the use of MOSFET devices resulted in a significant improvement with respect to the range of electrical resistance that could be generated in an integrated circuit, the arrangement of these devices requires that one node of the resistance device be coupled to ground, or the circuit substrate.

In various applications, there is a requirement for circuits with large time constants. As the ability to provide capacitive devices in integrated circuits is limited, there is a requirement for larger values of electrical resistance to satisfy the time constant requirements. Additionally, there is also a need for a high value electrical resistance device that has floating terminals.

SUMMARY OF THE INVENTION

In one aspect, the present invention provides an arrangement of integrated circuit devices including two matched transistors each in a diode connected configuration operating in the saturation region, the arrangement providing for coupling the transistors to a free terminal of at least one grounded resistor such that the circuit arrangement presents an electrical resistance between two non-grounded nodes of the circuit arrangement.

The circuit arrangement thus effectively converts the at least one grounded resistor coupled to the transistors to a floating resistance device wherein both terminals of the resistance device are available for use in an integrated circuit.

The grounded resistor may be of any type including a passive resistor constructed from poly silicon. However, in a preferred embodiment, the grounded resistor is a transistor operating as an active resistance device.

The magnitude of the electrical resistance presented between the two non-grounded nodes of the circuit arrangement is dependent upon the magnitude of the grounded electrical resistance coupled to the transistors of the circuit arrangement. In one particular circuit arrangement, the electrical resistance presented between the two non-grounded nodes of the circuit arrangement is equivalent to approximately twice the grounded electrical resistance coupled to the transistors. There may be any number of grounded resistors coupled to the transistors in a cascade arrangement thus determining the magnitude of the electrical resistance presented between the two non-grounded nodes of the circuit arrangement.

In a particularly preferred embodiment, two grounded transistors operating as active electrical resistance devices are coupled respectively each of the matched transistors of the circuit arrangement. In this embodiment, the transistors are MOSFET devices with their gate terminals coupled together to form a current mirror arrangement.

In this preferred form, the magnitude of the electrical resistance presented between the two non-grounded nodes of the circuit arrangement may be in the Giga-ohm range.

At times, the properties between the floating terminals and ground may include parasitics.

As a result of the circuit arrangement including the two diode connected matched transistors, the electrical resistance presented between the two non-grounded nodes of the circuit arrangement will be dependent upon the channel length modulation parameter, $\lambda$. As the channel length modulation parameter is process dependent, the magnitude of the electrical resistance presented between the two non-grounded nodes of the circuit arrangement will also be process dependent.

The skilled person in the art will appreciate that the electrical resistance is dependent on the output conductance of the device and the use of $\lambda$ is by way of a preferred arrangement only.

Reliance of the magnitude of the electrical resistance presented between the two non-grounded nodes of the circuit arrangement upon the process used to implement the integrated circuit is limiting. Accordingly, in a particularly preferred embodiment, the grounded resistors in the form of MOSFET devices with their gate terminals coupled together also have their gate terminals coupled to a third MOSFET device in a diode connected configuration to form a current mirror arrangement. The third MOSFET device is coupled to a current source and operable to supply an electrical current to the current mirror arrangement thus determining the magnitude of the electrical resistance presented by the grounded electrical resistance devices. As a result, in this particularly preferred embodiment, the magnitude of the electrical current supplied to the current mirror arrangement determines the magnitude of the electrical resistance presented between the two non grounded nodes of the circuit arrangement. Thus, it is possible to compensate or tune for the effects of the circuit arrangements dependence upon the channel length modulation for the particular process of manufacturing the integrated circuit by predetermining the electrical current supplied to the current mirror arrangement of the grounded active electrical resistance devices.

In another aspect, the present invention provides a method of determining the electrical resistance between two non-grounded nodes of an arrangement of integrated circuit devices including two matched transistors each in a diode connect configuration with each transistor coupled respectively to a grounded active resistance device, the active resistance devices forming a current mirror configuration with the gate terminal of each grounded active resistance device coupled to variable electrical current source, the method including the steps of:

Calculating the electrical current to be supplied to the coupled gate terminals of the active grounded resistance devices to produce a requisite conductance for each of the grounded active resistance devices according to the relationship:

$$g_d = \lambda I_d/(1+\lambda V_{ds}) \approx \lambda I_d$$

where $I_d$=1 µA and λ=1 mV$^{-1}$ the circuit arrangement thus providing an electrical resistance between the two non-grounded nodes of approximately twice the electrical resistance presented by each of the grounded active or passive resistance devices.

BRIEF DESCRIPTION OF THE DRAWINGS

The invention is now described by way of example with reference to the accompanying drawings in which.

DETAILED DESCRIPTION OF A PREFERRED EMBODIMENT

The following detailed description of the invention refers to the accompanying drawings. Although the description includes exemplary embodiments, other embodiments are possible, and changes may be made to the embodiments described without departing from the spirit and scope of the invention.

It has been recognised that resistors and transconductors have an important role in a wide variety of applications such as signal processing and neural networks, which generally utilise analogue VLSI circuits.

In the following description it is assumed that the source and the back gate for the corresponding n and p type MOS transistor are connected together, unless it is specifically indicated otherwise.

The circuit arrangement of a preferred embodiment of the invention includes two diode connect matched transistors operating in the saturation region.

Figure 1:
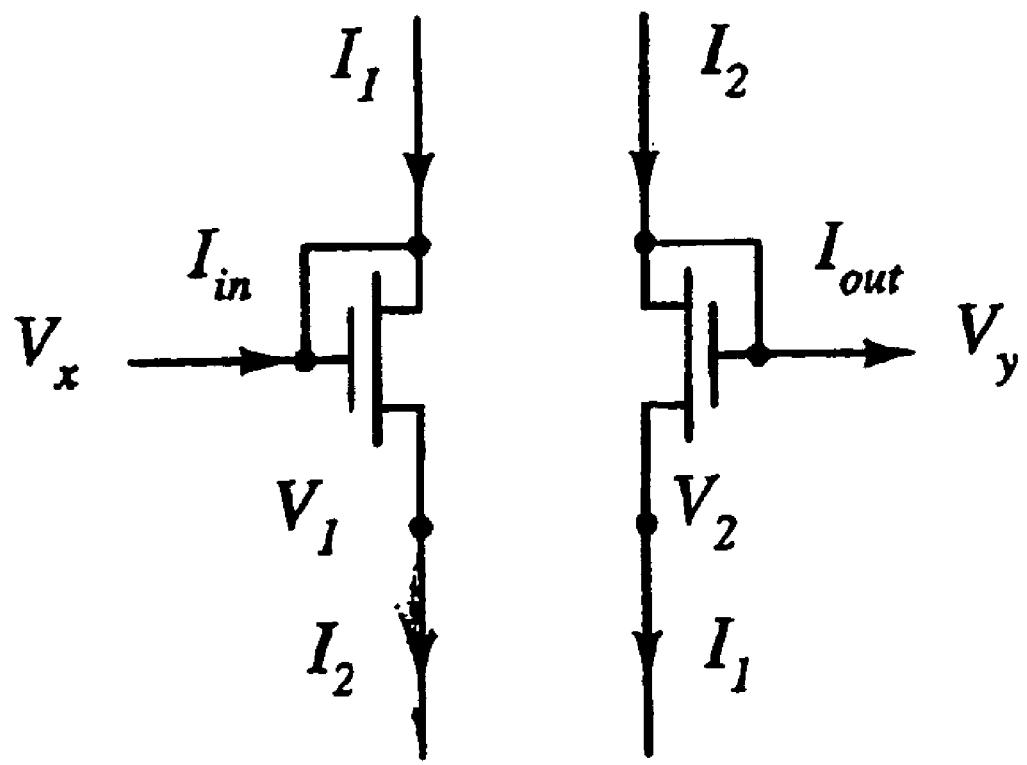
FIG. 1 details a circuit arrangement comprising two diode connected matched transistors.

With reference to FIG. 1, the circuit arrangement details two diode connected matched transistors operating in their saturation region. In the instance of FIG. 1, the $V_x$ and $V_y$ nodes and represent the floating resistor terminals with $I_{in}=I_{out}$ being the current passing through the circuit arrangement.

Considering the currents I1 and I2, an expression for each of these currents may be written as:

$$I_1 = K/2(V_y - V_2 - V_T)^2 \quad (1)$$

$$I_2 = K/2(V_x - V_1 - V_T)^2 \quad (2)$$

where
K=µ$_0$C$_{ox}$(W/L), A/V$^2$
µ$_0$ is the carrier mobility, cm$^2$/(V$_S$);
C$_{ox}$ is the oxide capacitance per unit area, F/m$^2$;
V$_T$ the MOS transistor threshold voltage, V;

The current passing through the circuit arrangement of FIG. 1 may be expressed as:

$$I_{in} = I_{out} = I_2 - I_1 \quad (3)$$

From equations (1), (2) and (3), $I_{out}$ can be written as:

$$I_{out} = K/2[(V_x - V_y) - (V_1 - V_2)][(V_x + V_y) - (V_1 + V_2)] - 2V_T] \quad (4)$$

The equivalent resistance, $R_{eqv}$ may be expressed as:

$$R_{eqv} = (V_x - V_y)/I_{in} = (V_x - V_y)/I_{out} \quad (5)$$

If we let $$V_1 = V_x - V_T + f(V_x) \quad (6)$$

and $$V_2 = V_y - V_T + f(V_y) \quad (7)$$

equation (4) can be written as:

$$I_{out} = K/2(f(V_x)^2 - f(V_y)^2) \quad (8)$$

This last equation (8) shows that the current passing through the circuit arrangement is independent of the MOS transistor threshold voltage and is a function of $V_x$ and $V_y$ and is proportional to K.

Circuit Arrangement Including Matched Transistors and Ideal Resistors

Figure 2:
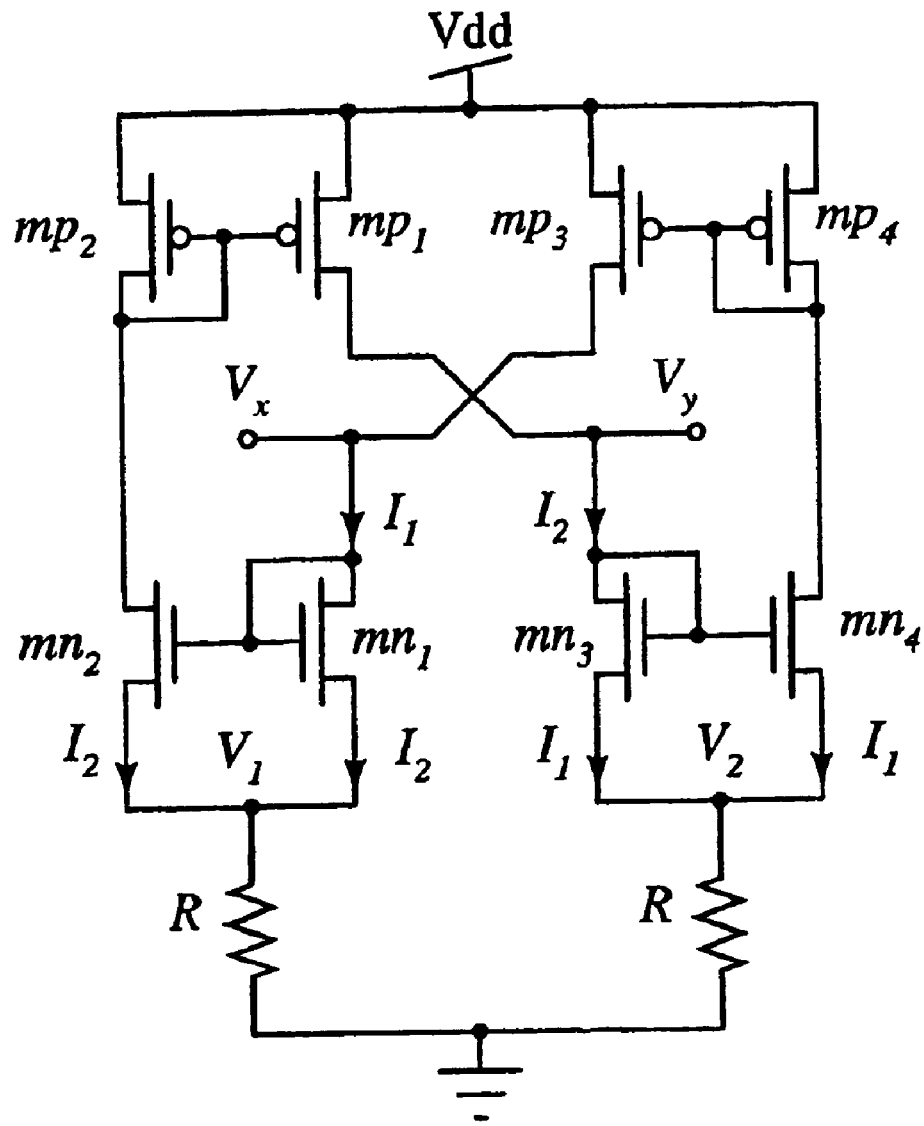
FIG. 2 details an embodiment of a complete circuit arrangement including the two diode connected matched transistors of FIG. 1 coupled to two grounded passive resistors.

A complete circuit arrangement including two diode connected matched transistors operating in their saturation region is detailed in FIG. 2. The circuit arrangement of FIG. 2 satisfies equations 6 and 7. In this arrangement, the current passing through mn$_1$ is mirrored using mn$_2$ and fed back to the V$_y$ terminal of mn$_3$. In a similar manner, the current passing through mn$_3$ is mirrored by mn$_4$ and fed back to the $V_x$ terminal of $mn_1$. The circuit arrangement detailed in FIG. 2 includes two grounded resistors, R, coupled to circuit nodes $V_1$ and $V_2$.

In the instance of FIG. 2, the two grounded resistors, R, are ideal resistors for the purpose of analysis of the circuit arrangement including the two diode connected matched resistors operating in their saturation region.

The relationship between $V_2$ and $V_1$, while assuming an ideal resistor connected between $V_1$ and ground, can be expressed as:

$$V_1 = R(2I_2) = KR(V_x - V_1 - V_T)^2 \qquad (9)$$

Solving equation (9) for $V_1$ provides two solutions, the feasible solution being:

$$V_1 = V_x - V_T + [(1 - (1 + 2KR(V_x - V_T))^{1/2})/2KR] \qquad (10)$$

A similar expression for $V_2$ can be expressed as:

$$V_2 = V_y - V_T + [(1 - (1 + 2KR(V_y - V_T))^{1/2})/2KR] \qquad (11)$$

Comparing equations (10) and (11) with equations (6) and (7) respectively, $f(V_x)$ and $f(V_y)$ may be expressed as:

$$f(V_x) = (1 - (X)^{1/2})/2KR \qquad (12)$$

$$f(V_y) = (1 - (Y)^{1/2})/2KR \qquad (13)$$

where $$X = 1 + 2KR(V_x - V_T)$$

$$Y = 1 + 2KR(V_y - V_T)$$

Substituting the values of $f(V_x)$ and $f(V_y)$ from equations (12) and (13) in equation (8), $I_{out}$ may be written as:

$$I_{out} = (1/8KR^2)[(1-(X)^{1/2})^2 - (1-(Y)^{1/2})^2] \qquad (14)$$

Assuming the square root of $X \gg 1$ and the square root of $Y \gg 1$, which is a valid assumption for large values of R, then equation (14) reduces to:

$$I_{out} = (1/8KR^2)(X-Y) \qquad (15)$$

Substituting the values of X and Y in equation (15) with $$V_x = V_B + V_{in}/2; \text{ and}$$

$$V_y = V_B - V_{in}/2$$

equation (15) reduces to:

$$I_{out} = V_{in}/2R \qquad (16)$$

Equation (16) illustrates that the equivalent floating resistor value is independent of the process model parameters and is also independent of the MOS transistors threshold voltage. An expression for the equivalent resistance $R_{eqv}$ can be written by substituting equation (16) into equation (5), resulting in the expression:

$$R_{eqv} = V_{in}/I_{out} = 2R \qquad (17)$$

Equation 17 shows that the voltage-current relationship of the circuit arrangement of FIG. 2 resembles an ideal resistor with an equivalent electrical resistance equal to the sum of the grounded resistors, namely 2R.

Figure 3:
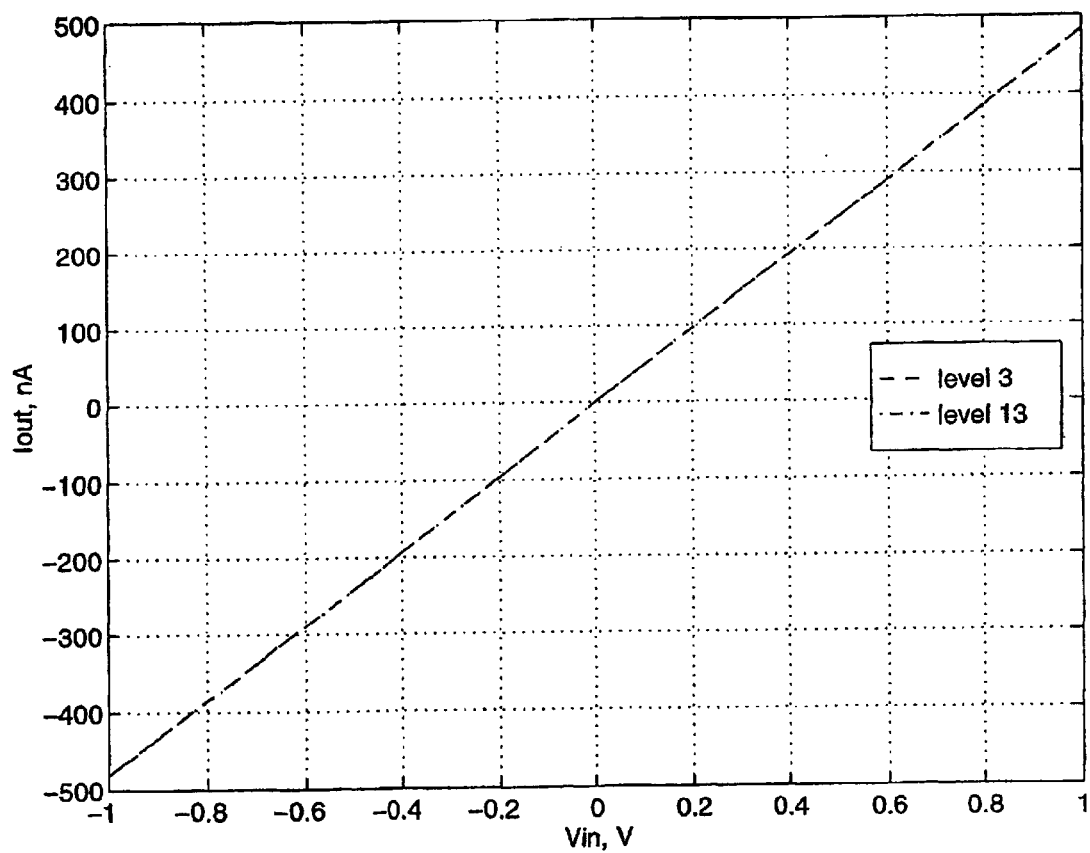
FIG. 3 is a graphical representation of the electrical resistance between terminals $V_x$ and $V_y$ of the circuit arrangement of FIG. 2, the graphical representation resulting from a simulation of the operation of the circuit arrangement.

FIG. 3 is a graphical representation of the electrical resistance between terminals $V_x$ and $V_y$ if the circuit arrangement of FIG. 2 resulting from a simulation with all transistors sizes set to W/L=12$\mu$/12$\mu$ using the HSPICE simulator with levels 3 and 13 model parameters obtained from MOSIS (a US corporation providing the interface between foundries and designers) for a 1.2$\mu$ double poly, double metal, n-well process. The simulation shows that the electrical resistance between terminals $V_x$ and $V_y$ is greater than the sum of the two grounded resistors. This is due to the approximation made in equation (14). The introduced harmonic distortion by the circuit arrangement when using ideal resistors is detailed in FIG. 4.

Figure 4:
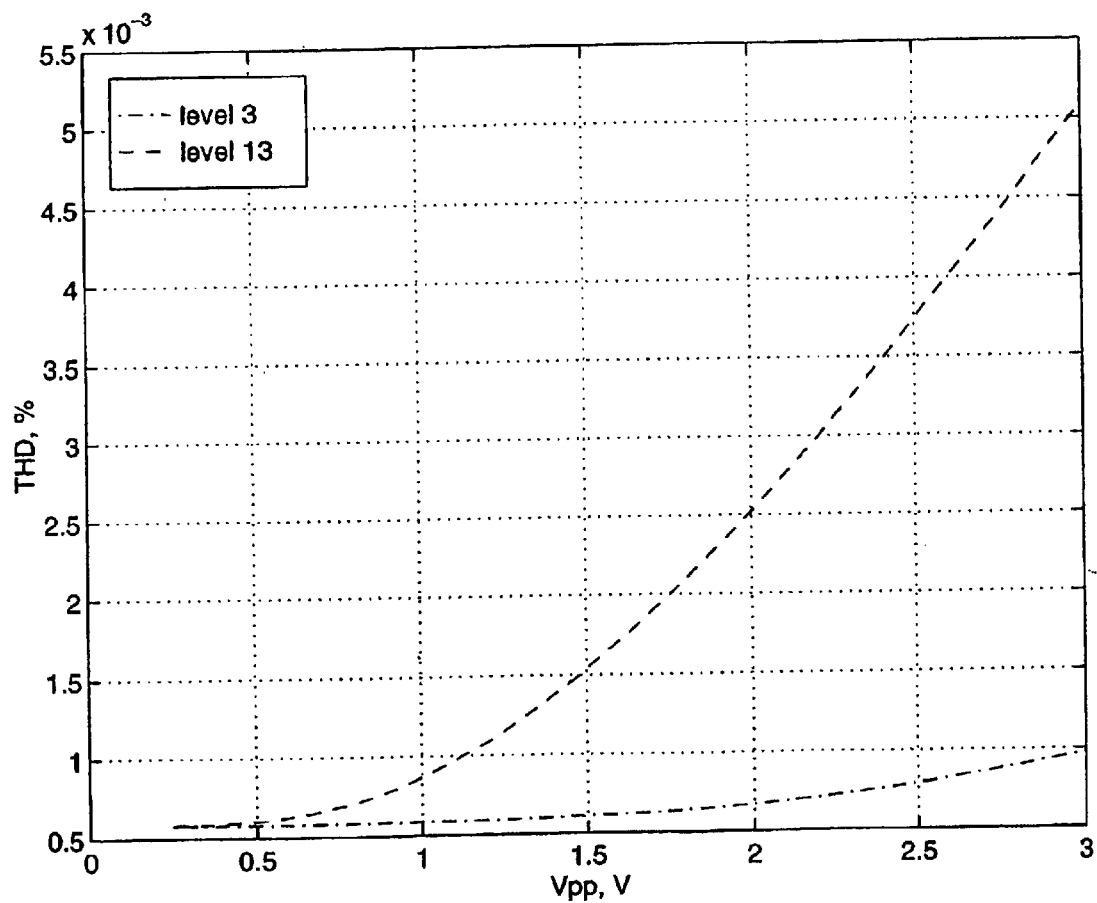
FIG. 4 is a graphical representation of the total harmonic distortion (THD) of the circuit arrangement of FIG. 2 as a function of the input signal amplitude in peak to peak voltage.

With reference to FIG. 4, the total harmonic distortion (THD) introduced by the circuit arrangement is illustrated as a function of the peak to peak voltage input signal amplitude.

Circuit Arrangement Including Matched Transistors and Active Resistance Devices

The analysis presented above remains valid if the ideal resistors R are replaced by an active grounded resistor or conductance. The circuit arrangement can be used to convert a grounded active electrical resistance device to a floating resistance device by connecting two matched grounded resistors or conductances at $V_1$ and $V_2$. As the circuit arrangement of FIG. 1 provides for the coupling of active electrical resistance devices, such as in the arrangement of FIG. 5, a very high value floating (VHVF) resistor can be presented between the terminals $V_x$ and $V_y$. This is achieved in the preferred embodiment by coupling a very high value active resistance device, or grounded output conductance, between nodes $V_1$ and $V_2$ with the output conductance of the MOS transistor operating in the saturation region.

A MOS transistor biased with relatively small current provides a very high value output conductance in the range of Giga-ohms (G$\Omega$'s). However, a MOS transistor output conductance is dependent on the channel length modulation parameter $\lambda$, which is generally defined as:

$$\lambda = (\in_{si}/qN_{eff}V_{ds} - V_{Dsat})^{1/2}/L \qquad (18)$$

Where
$\in_{si}$ is the dielectric constant of silicon;
$N_{eff}$ is the substrate doping density;
q is the electron charge;
$V_{ds}$ is the drain to source voltage;
$V_{Dsat}$ is the drain saturation voltage;
L is the drain saturation voltage;

From equation (18), it can be recognised by those skilled in the art that $\lambda$ is a process dependent parameter. Generally, it is not considered desirable to produce a circuit arrangement the operation of which relies upon a process dependent parameter. However, in the instance of the circuit arrangement of the preferred embodiment, the dependence on the process dependent parameter $\lambda$ can be compensated by adjusting the value of the current supplied by transistor mnn to the transistors $mn_5$ and $mn_6$.

Using a simple transistor model which includes the channel length effect, the output conductance $g_d$ of $mn_5$ or $mn_6$ may be calculated at constant gate to source voltage as $$g_d = \lambda I_d/(1 + \lambda V_{ds}) \approx \lambda I_d \qquad (19)$$

where $I_d$ is the drain current.

For an $I_d$=1 $\mu$A and $\lambda$=1 mV$^{-1}$ (extracted from level 13 model ammeters at 1 $\mu$A bias current), the equivalent floating resistor is 2 G$\Omega$.

Figure 5:
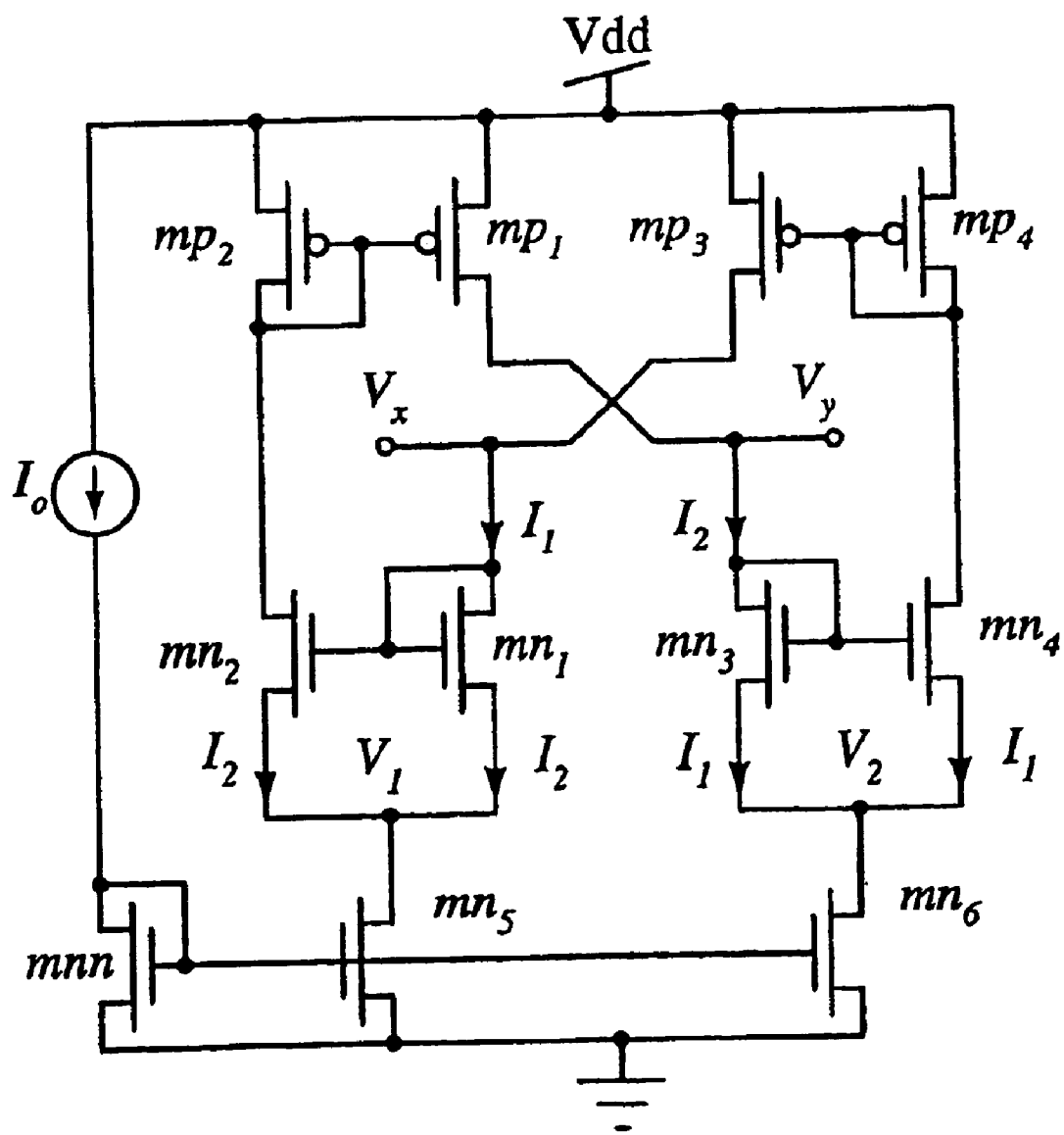
FIG. 5 details an embodiment of a complete circuit arrangement including two diode connected matched transistors coupled to two grounded MOSFET devices operating as active resistance devices.

The circuit shown in FIG. 5 was simulated using a large value of reference current in the $\mu$A range, to demonstrate the circuit operation outside the subthreshold region. The simulation result, with the reference current $I_o$ was swept from 7.5 µA to 20 µA in 2.5 µA steps, the results of the simulation being detailed in FIG. 6.

The circuit arrangement detailed in FIG. 5 was re-simulated using a small bias current in the nA range. This simulation was performed to ensure that all transistors are operating in the subthreshold region of operation. The simulation results, with $I_a$ sweeping from 500 nA to 1 µA in 100 nA steps, are detailed in FIG. 7.

Figure 6:
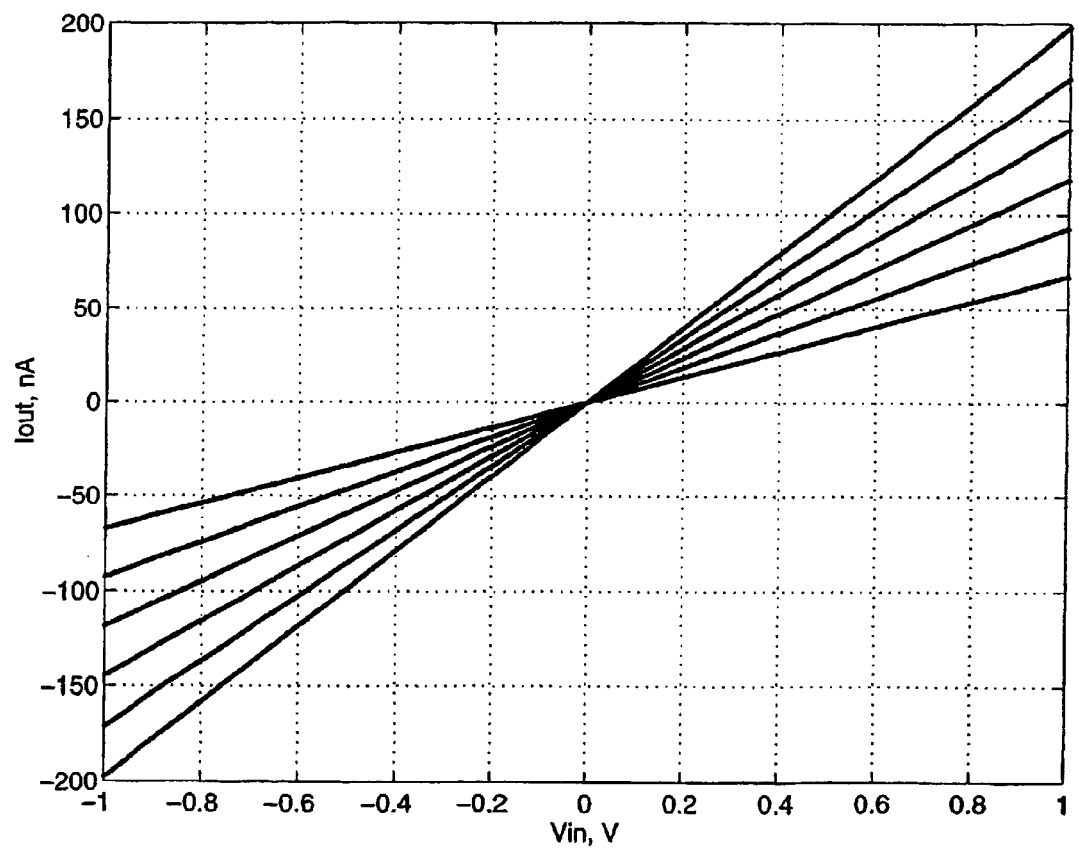
FIG. 6 is a graphical representation of the electrical resistance between terminals $V_x$ and $V_y$ of the circuit arrangement of FIG. 5 for electrical current in the range of 7.5 µA to 20 µA, the graphical representation resulting from a simulation of the operation of the circuit arrangement.
Figure 7:
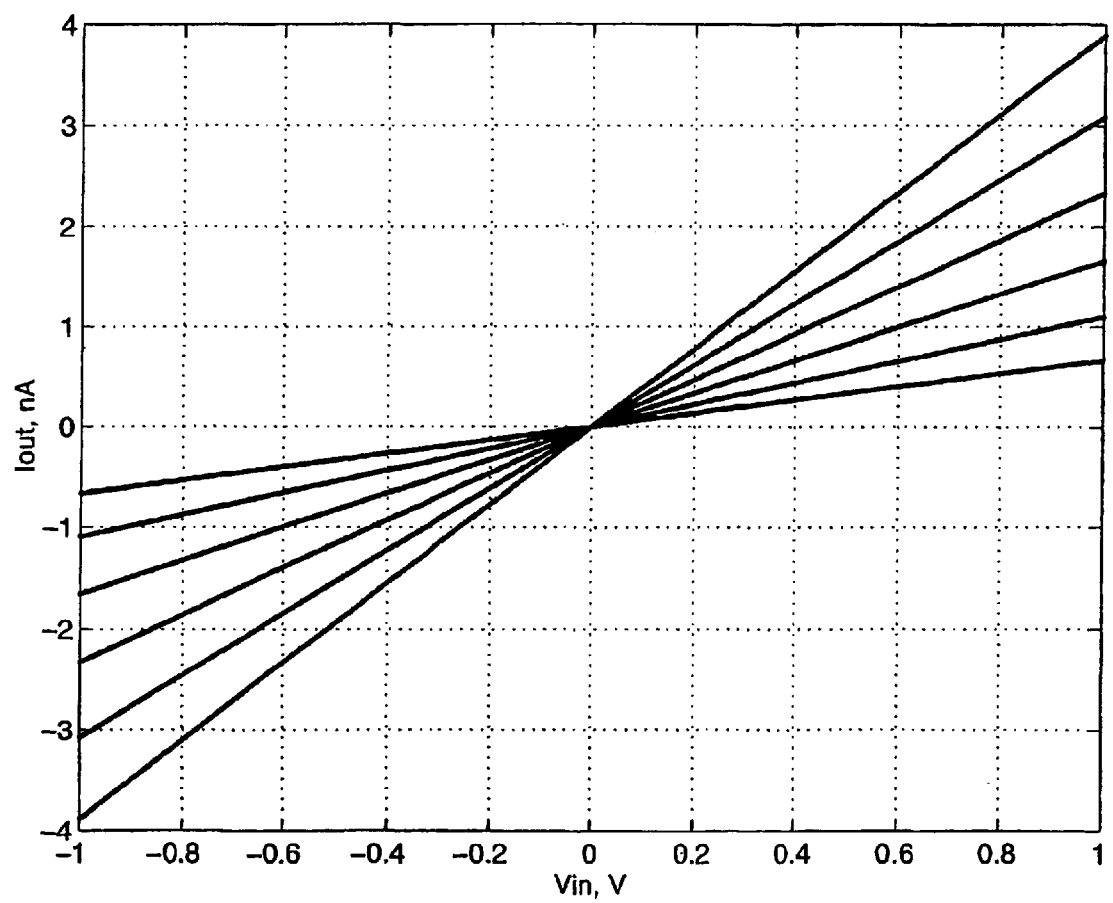
FIG. 7 is a graphical representation of the electrical resistance between terminals $V_x$ and $V_y$ of the circuit arrangement of FIG. 5 for electrical current in the range of 500 nA to 1 µA, the graphical representation resulting from a simulation of the operation of the circuit arrangement.

As can be seen from FIGS. 6 and 7, the circuit exhibits a relatively linear resistor characteristic in both regions of operation.

Design Example

To demonstrate the use of the high value resistor in a practical design example, the circuit arrangement of the preferred embodiment was used in the design of an active low frequency, current controlled, band pass filter. This type of filter presents a major problem in motion detection and biomedical systems including pacemakers.

The band pass filter requirements selected were:

(i) 100 Hz bandwidth;

(ii) the first cut-off frequency at 1 to 10 Hz with the second at 100 Hz;

(iii) relatively high gain;

(iv) relatively small silicon area requirement with a capacitor of 1 pF; and (v) moderate to low power consumption.

Figure 8:
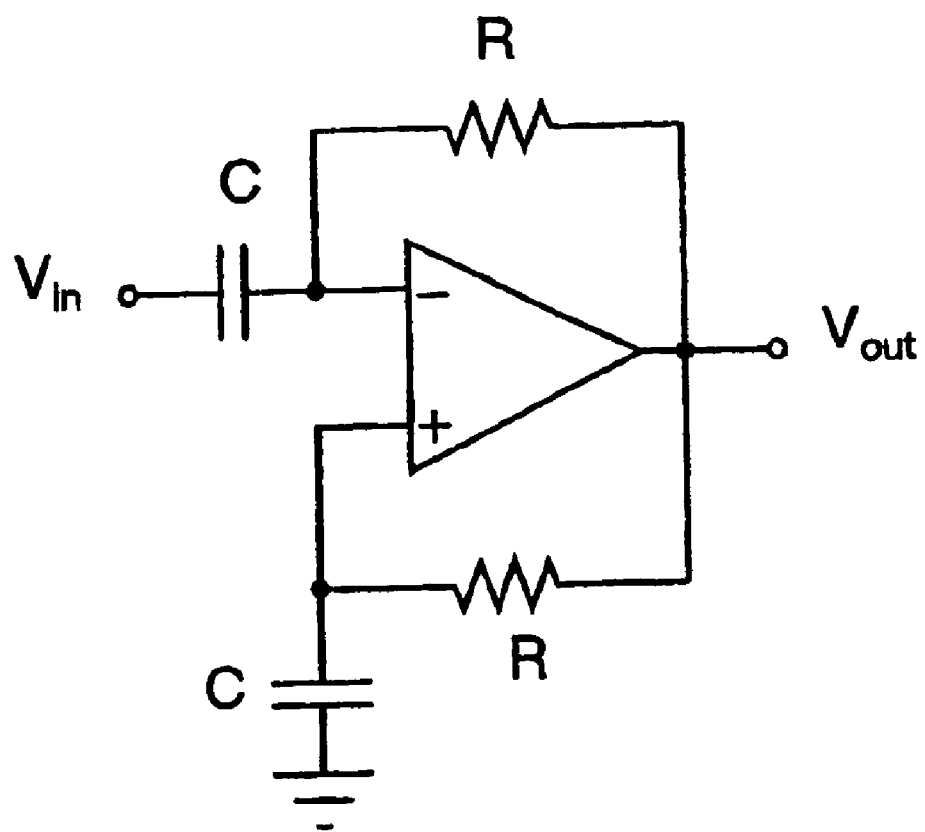
FIG. 8 details a circuit arrangement of a low frequency differentiator.

A band-pass filter with these requirements may be provided with the circuit arrangement detailed in FIG. 8. A differentiator is used to set the lower cut-off frequency and an operational amplifier is used to provide the required gain and to set the upper cut-off frequency, which is function of the operational amplifier bias current.

The transfer function of the circuit detailed in FIG. 8 can be expressed as:

$$H(s) = -A(s)(RCs)/(1+RCs) \qquad (20)$$

where $A(s)$ is the Amplifier gain.

Figure 9:
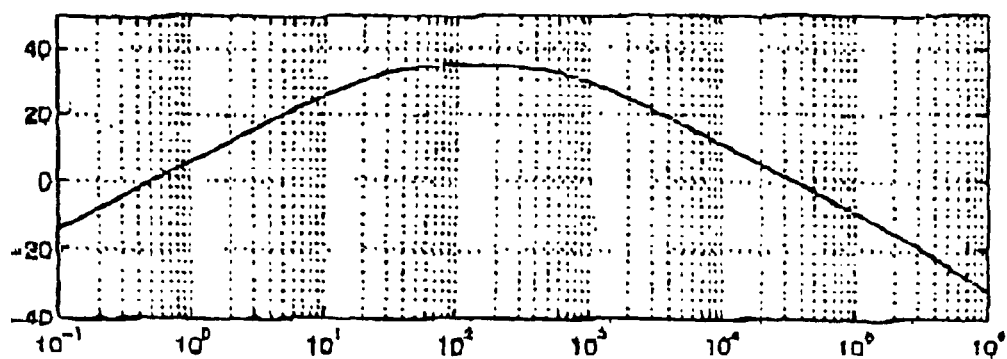
FIGS. 9A, 9B are graphical representations of the frequency response of the circuit arrangement of FIG. 8 with the circuit arrangement including ideal resistors and active resistance devices respectively.
Figure 9:
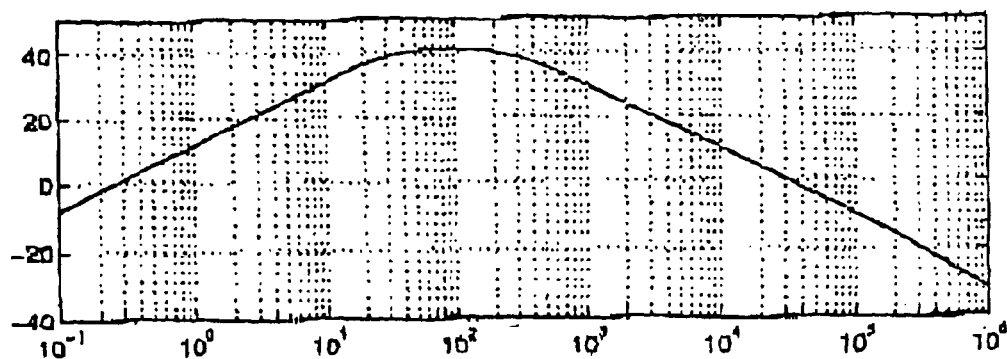

The simulation results for the circuit detailed in FIG. 8 using an ideal resistor, R, and the circuit arrangement of the preferred embodiment to provide a floating resistor are detailed in FIG. 9.

The upper and lower cut-off frequencies for the ideal and floating resistor are slightly different due to the loading effect the floating resistor causes to the filter which is not included in the filter simulation with ideal resistors.

Conclusion

The present invention embodies many advantages including the provision of a circuit arrangement to convert fixed, or grounded resistors, to floating resistors. In particular, the circuit arrangement of the present invention provides for the coupling of active electrical resistance devices to provide a relatively high value electrical resistance between two non-grounded nodes of the circuit arrangement in the order of Giga-ohms.

A particularly preferred form of the invention provides for the magnitude of the floating electrical resistance to be determined by the magnitude of electrical current supply thus providing a means to select the magnitude of the floating electrical resistance by selecting the magnitude of electrical current supply.

The circuit arrangement requires relatively few active devices and consumes a relatively small amount of electrical power in operation.

The floating resistor of the present invention may be used in applications where a relatively high value resistor consuming a relatively small area of silicon, exhibiting relatively good linearity and wide dynamic range are required. Applications for such a device include neural networks, image processing and vision systems.

Further advantages and improvements may very well be made to the present invention without deviating from its scope. Although the invention has been shown and described in what is conceived to be the most practical and preferred embodiment, it is recognized that departures may be made therefrom within the scope and spirit of the invention, which is not to be limited to the details disclosed herein but is to be accorded the full scope of the claims so as to embrace any and all equivalent devices and apparatus.

In any claims that follow and in the summary of the invention, except where the context requires otherwise due to express language or necessary implication, the word "comprising" is used in the sense of "including", i.e. the features specified may be associated with further features in various embodiments of the invention.

What is claimed is:

1. An arrangement of integrated circuit devices including two matched transistors each in a diode connected configuration operating in the saturation region, the arrangement providing for coupling the transistors to a free terminal of at least one grounded resistor such that the circuit arrangement presents an electrical resistance between two non-grounded nodes of the circuit arrangement.

2. An arrangement as in claim 1 wherein said arrangement effectively converts the at least one grounded resistor coupled to the transistors to a floating resistance device wherein both terminals of the resistance device are available for use in an integrated circuit.

3. An arrangement as in claim 1 or claim 2 wherein the grounded resistor may be of any type including a passive resistor constructed from poly silicon.

4. An arrangement as in any one of the above claims wherein said grounded resistor is a transistor operating as an active resistance device.

5. An arrangement as in any one of the above claims wherein the electrical resistance presented between the two non-grounded nodes of the circuit arrangement is equivalent to approximately twice the grounded electrical resistance coupled to the transistors.

6. An arrangement as in claim 5 wherein there are a plurality of grounded resistors coupled to the transistors in a cascade arrangement thereby determining the magnitude of the electrical resistance presented between the two non-grounded nodes of the circuit arrangement.

7. An arrangement as in claim 6 wherein two grounded transistors operating as active electrical resistance devices are coupled respectively each of the matched transistors of the circuit arrangement the transistors being MOSFET devices with their gate terminals coupled together to form a current mirror arrangement.

8. An arrangement as in any one of the above claims wherein the properties between the floating terminals and ground may include parasitics.

9. An arrangement as in any one of the above claims wherein the grounded resistors in the form of MOSFET devices with their gate terminals coupled together also have their gate terminals coupled to a third MOSFET device in a diode connected configuration to form a current mirror arrangement.

10. An arrangement as in claim 9 wherein the third MOSFET device is coupled to a current source and operable to supply an electrical current to the current mirror arrangement thus determining the magnitude of the electrical resistance presented by the grounded electrical resistance devices.

11. A method of determining the electrical resistance between two non-grounded nodes of an arrangement of integrated circuit devices including two matched transistors each in a diode connect configuration with each transistor coupled respectively to a grounded active resistance device, the active resistance devices forming a current mirror configuration with the gate terminal of each grounded active resistance device coupled to variable electrical current source, the method including the steps of:

calculating the electrical current to be supplied to the coupled gate terminals of the active grounded resistance devices to produce a requisite conductance for each of the grounded active resistance devices according to the relationship:

$$g_d = \lambda I_d/(1+\lambda V_{ds}) \approx \lambda I_d$$

where $I_d = 1 \ \mu A$ and $\lambda = 1 \ mV^{-1}$ the circuit arrangement thus providing an electrical resistance between the two non-grounded nodes of approximately twice the electrical resistance presented by each of the grounded active or passive resistance devices.

* * * * *